United States Patent
Choe

(10) Patent No.: US 7,042,379 B2
(45) Date of Patent: May 9, 2006

(54) RETURN-TO-ZERO CURRENT SWITCHING DIGITAL-TO-ANALOG CONVERTER

(75) Inventor: Myung-Jun Choe, Thousand Oaks, CA (US)

(73) Assignee: Rockwell Scientific Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 11/134,121

(22) Filed: May 19, 2005

(65) Prior Publication Data

US 2006/0022856 A1    Feb. 2, 2006

Related U.S. Application Data

(60) Provisional application No. 60/592,420, filed on Jul. 30, 2004.

(51) Int. Cl.
*H03M 1/66* (2006.01)

(52) U.S. Cl. ..................... 341/144; 341/153

(58) Field of Classification Search ........ 341/144–154, 341/136
See application file for complete search history.

(56) References Cited

U.S. PATENT DOCUMENTS

| | | | | |
|---|---|---|---|---|
| 5,307,067 A | * | 4/1994 | Kimura et al. | 341/159 |
| 5,859,606 A | * | 1/1999 | Schrader et al. | 341/144 |
| 6,246,351 B1 | * | 6/2001 | Yilmaz | 341/145 |
| 6,281,825 B1 | * | 8/2001 | Lee | 341/144 |
| 6,362,765 B1 | * | 3/2002 | Masuda | 341/144 |
| 6,448,917 B1 | * | 9/2002 | Leung et al. | 341/144 |
| 6,812,878 B1 | | 11/2004 | Jewett et al. | 341/144 |
| 6,952,177 B1 | * | 10/2005 | Hitko | 341/144 |

* cited by examiner

*Primary Examiner*—Rexford Barnie
*Assistant Examiner*—Lam T. Mai
(74) *Attorney, Agent, or Firm*—Koppel, Patrick & Heybl

(57) ABSTRACT

A "return-to-zero" (RZ) current switching DAC includes an analog output node for which a "zero" potential has been defined. The outputs of a plurality of current sources are selectively directed to respective intermediate nodes in response to respective control signals, which are varied in synchronization with a clock signal CK. A plurality of RZ circuits are connected between respective intermediate nodes and the analog output node. In a preferred embodiment, each RZ circuit directs the current applied to a respective intermediate node to ground or to the analog output node in synchronization with CK. An output network pulls the analog output node to the "zero" potential when currents applied to the intermediate nodes are directed to ground.

28 Claims, 10 Drawing Sheets

RETURN-TO-ZERO CURRENT SWITCHING DIGITAL-TO-ANALOG CONVERTER

This application claims the benefit of provisional patent application No. 60/592,420 to Choe, filed Jul. 30, 2004.

BACKGROUND OF THE INVENTION

1. Field of the Invention

This invention relates to the field of digital-to-analog converters (DACs), and particularly to techniques for reducing switching noise in current switching DACs.

2. Description of the Related Art

A basic current switching DAC is shown in FIG. 1a. A plurality of current sources 10, 12 are connected to a analog output lines 14, 16 via pairs of switches 18, 20 and 22, 24. The switches are typically implemented with transistors, which are controlled using respective control signals 26, 28, 30, 32 provided by a latch circuit 34. Latch circuit 34 receives a digital input word via a set of input lines, as well as a clock signal.

The digital input word represents a desired analog output voltage. In operation, latch circuit 34 responds to an applied digital input word by setting control signals 26, 28, 30, 32, thereby switching selected current sources to selected output lines as needed to obtain the desired analog output voltage. Latch circuit 34 is clocked, such that control signals 26, 28, 30, 32 change state in synchronization with the applied clock.

The DAC's operation is illustrated in the timing diagram shown in FIG. 1b. The diagram depicts the applied clock signal, along with an ideal DAC output 35, and an actual DAC output 36. As can be seen, the actual DAC output exhibits a considerable amount of noise; this is caused by switching slew and glitches which arise when the control signals change state, disconnecting some current sources from the analog output lines and connecting others. This non-linear source of error can result in an unacceptable level of distortion in the DAC output.

The operation of even an ideal DAC results in a frequency dependent attenuation of the DAC output; this is seen in the output spectrum shown in FIG. 1c. For a typical current switching DAC as shown in FIG. 1a, the DAC's output signal power falls off at a rate given by $$\frac{\sin(x)}{x},$$

where $f_{CLK}$ is the frequency of the applied clock signal and x is given by $$\frac{\pi * freq}{f_{CLK}},$$

where freq is the frequency of the DAC's analog output signal. This attenuation can necessitate the use of a correction filter, and can significantly limit the DAC's use in high frequency applications.

One approach to reducing noise caused by switching slew and glitches which arise when the current sources are switched is found in U.S. Pat. No. 6,812,878 to Jewett et al. As shown in FIG. 3 of Jewett, clocked resampling switches are interposed between the current source switches and the analog output lines. The resampling switches are operated such that the current source switches are temporarily disconnected from the analog output lines when the control signals change state, thereby preventing switching noise from reaching the output.

However, this approach also has drawbacks. For example, the resampling switches are implemented with transistors. Since the base nodes of the resampling switch transistors connected to the output line are clocked, clock noise can be coupled onto the analog output lines via the parasitic capacitances that exist across the terminals of the resampling switch transistors. In addition, in operation, the DAC's current sources are connected to ground for half of every switching cycle; as such, the DAC output power is half that of a conventional "non-return-to-zero" (NRZ) DAC, without any means to recover the lost power

SUMMARY OF THE INVENTION

A "return-to-zero" (RZ) current switching DAC is presented which overcomes the problems noted above, reducing switching- and clock-induced noise and extending the frequency range over which the DAC may be used.

The present current switching DAC includes at least one analog output node for which a "zero" potential has been defined, which provides the DAC's analog output voltage, and a digital input which receives a digital input word representative of a desired analog output voltage. In operation, the outputs of respective current sources are selectively directed to respective intermediate nodes in response to respective control signals. The states of the respective control signals vary with the digital input word, and in synchronization with a first clock signal CK. The DAC is preferably arranged to also generate a second clock signal $\overline{CK}$, which is the inverse of CK.

The present DAC includes a plurality of "return-to-zero" (RZ) circuits, connected between respective intermediate nodes and single or differential analog output nodes. Each RZ circuit comprises a first transistor connected between the intermediate node and an analog output node and driven with a fixed bias voltage $V_{bias}$, and a second transistor connected between the intermediate node and a fixed voltage (preferably ground) and driven with a control signal. When the DAC operates in RZ mode, the control signal is arranged to toggle above and below $V_{bias}$ in synchronization with the CK signal. Thus, when the control signal toggles below $V_{bias}$, the first transistor turns on and directs current source current to an analog output node, and when the control signal toggles above $V_{bias}$, the second transistor turns on and directs the current source current to the fixed voltage. Current conducted by the first transistor is coupled to an analog output node via an output network, typically a R-2R ladder network, which is connected to the analog output node and arranged such that the analog output voltage is pulled to the "zero" potential when the currents applied to the intermediate nodes are directed to the fixed voltage via the RZ circuits. When so arranged, the RZ circuits prevent switching noise that arises when clock signal CK is asserted and the control signals change state from appearing on the analog output node. In addition, because each RZ circuits' first transistor is not clocked, clock noise that might otherwise be coupled to the analog output nodes is substantially reduced.

A control circuit generates the control signal, and is preferably arranged to enable the DAC to operate in either RZ or non-return-to-zero (NRZ) modes. When operated in RZ mode, the control circuit provides a toggling control signal which tracks clock signal CK as described above. When in NRZ mode, the control signal is held at a voltage selected to continuously hold the RZ circuits' second transistors off, so that current from the current sources is always directed to the analog output nodes.

Further features and advantages of the invention will be apparent to those skilled in the art from the following detailed description, taken together with the accompanying drawings.

BRIEF DESCRIPTION OF THE DRAWINGS

FIG. 1b is a timing diagram for the known DAC shown in FIG. 1a.

FIG. 1c is an output spectrum diagram for the known DAC shown in FIG. 1a.

FIG. 2b is a timing diagram for the RZ DAC shown in FIG. 2a.

FIG. 3a is an output spectrum diagram for the RZ DAC shown in FIG. 2a.

FIG. 4b is a timing diagram for the control circuit shown in FIG. 4a.

DETAILED DESCRIPTION OF THE INVENTION

Figure 1A:
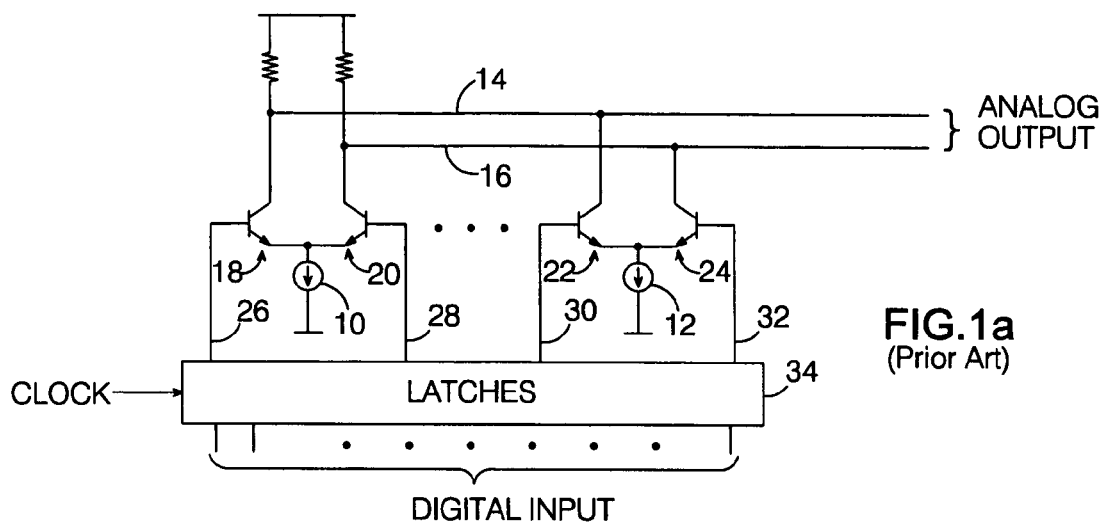
FIG. 1a is a block/schematic diagram of a known current switching DAC.
Figure 1B:
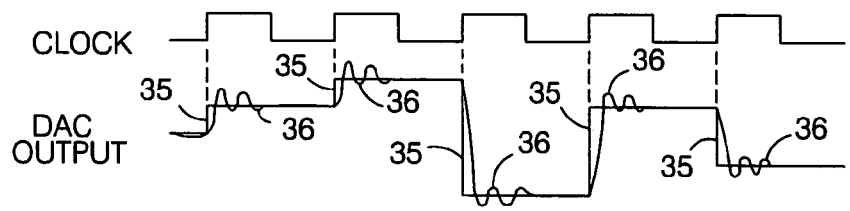
Figure 1C:
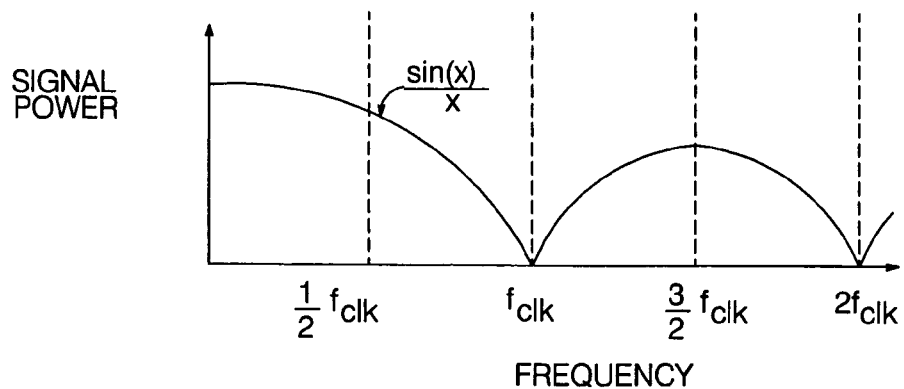
Figure 2A:
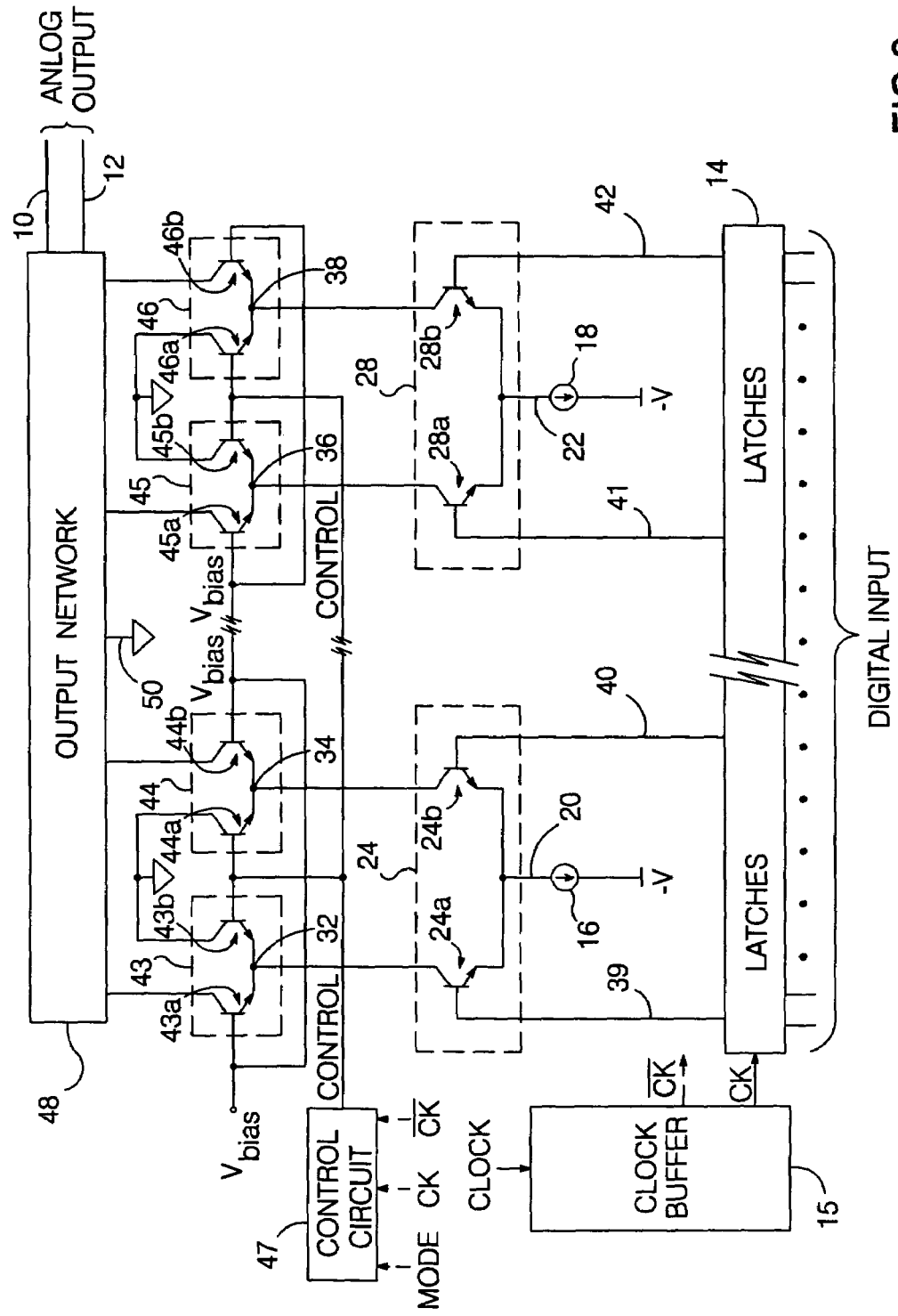
FIG. 2a is a block/schematic diagram of an RZ current switching DAC per the present invention.

An RZ current switching DAC per the present invention is shown in FIG. 2a. The DAC receives a digital input word and provides an analog output voltage. In the exemplary embodiment shown in FIG. 2a, the DAC provides a differential output on first and second analog output lines 10 and 12. A "zero" potential, which could be ground or a non-zero potential, is pre-defined for the DAC's analog output lines. The digital input word is received by clocked circuitry 14, typically a set of latches. The DAC typically includes a clock buffer 15, which receives a clock signal CLOCK, and provides a first clock signal CK and a second clock signal $\overline{CK}$ which is the inverse of CK. The DAC includes a plurality of current sources; only two current sources (16, 18) are shown in FIG. 2a, but a practical DAC would typically include 10 or more current sources. Current sources 16 and 18 have respective outputs 20 and 22.

In the differential embodiment shown, the current source outputs are connected to respective "current switches" 24 and 28. As used herein, a current switch comprises a current input, two current outputs, and two control signal inputs; a current applied to the current input is directed to one or the other of the two current outputs in response to control signals applied to the control signal inputs. Each current switch is typically implemented with two transistors, with their emitters (if bipolar) or sources (if FETs) connected to the current input, their collectors (or drains) connected to respective current outputs, and their bases (or gates) connected to respective control signal inputs.

In the implementation shown in FIG. 2a, current switch 24 comprises NPN transistors 24a and 24b, and current switch 28 comprises NPN transistors 28a and 28b. In a conventional current switching DAC, current switches 24 and 28 would be connected between their respective current source outputs and analog output lines 10 and 12. Here, however, current switch 24 is connected between current source output 20 and a pair of intermediate nodes 32 and 34, and current switch 28 is connected between current source output 22 and a pair of intermediate nodes 36 and 38. Transistors 24a and 24b direct current from current source output 20 to intermediate nodes 32 or 34, respectively, in response to respective control signals 39 and 40 received from clocked circuitry 14. Similarly, transistors 28a and 28b direct current from current source output 22 to intermediate nodes 36 or 38, respectively, in response to respective control signals 41 and 42 received from clocked circuitry 14. The state of each control signal depends on the digital input word applied to the DAC. The control signals change state in synchronization with the CK signal provided to clocked circuitry 14, disconnecting some current sources from their intermediate nodes and connecting others. If the intermediate nodes were connected directly to the analog output lines, as in the prior art, switching noise might appear on the analog output lines when the data switches are turned on and off, i.e., in synchronization with the CK signal.

The invention overcomes this problem by interposing RZ circuits (43, 44, 45, 46) between respective intermediate nodes and the analog output lines. Each RZ circuit comprises a current switch made with two transistors: a first transistor connected between an intermediate node and an analog output line which is driven with a fixed bias voltage $V_{bias}$, and a second transistor connected between the intermediate node and a fixed voltage which is driven with a control signal (CONTROL) provided by a control circuit 47. The "fixed voltage" is preferably circuit ground, and is referred to as such herein, though another fixed potential may be used in some applications.

In the exemplary embodiment of FIG. 2a, RZ circuit 43 comprises transistors 43a and 43b, RZ circuit 44 comprises transistors 44a and 44b, RZ circuit 45 comprises transistors 45a and 45b, and RZ circuit 46 comprises transistors 46a and 46b. Transistors 43b, 44a, 45b and 46a are driven by the CONTROL signal, and transistors 43a, 44b, 45a and 46b are driven by $V_{bias}$.

The DAC is arranged such that CONTROL toggles above and below $V_{bias}$. When CONTROL toggles below $V_{bias}$, each RZ circuits' second transistor turns off and its first transistor turns on and directs current from its intermediate node to an analog output line. When CONTROL toggles above $V_{bias}$, its first transistor turns off and its second transistor turns on and directs current from its intermediate node to circuit ground.

The DAC is preferably arranged such that CONTROL toggles in synchronization with the CK signal, such that each RZ current switch directs a current applied to a respective one of the intermediate nodes to circuit ground in synchronization with CK, thereby preventing switching noise that arises when CK is asserted from appearing on an analog output line. The DAC has an associated switching cycle, which is divided into two portions. The DAC is arranged such that clock signal CK is asserted during one portion of the switching cycle, and clock signal $\overline{CK}$ is asserted during the other portion of the switching cycle. As used herein, a clock signal is "asserted" when it toggles to the state required to close the transistor it is connected to; for the NPN transistor implementation employed in FIG. 2a, a clock signal is asserted when it toggles from low to high.

The RZ current switch outputs are coupled to analog output lines 10, 12 via an output network 48, which may comprise, for example, a R-2R ladder network; one possible embodiment of output network 48 is discussed below in relation to FIG. 2c. The output network is connected to a node 50, the potential of which defines the system's pre-defined "zero" potential each analog output line is pulled up to when the currents applied to the intermediate nodes are directed to circuit ground via the RZ current switches. In FIG. 2a, the "zero" potential is circuit ground, though it could be VDD or some other potential. When the DAC is configured as shown in FIG. 2a, the current sources (16, 18) would typically be connected between the data switches and the most negative potential in the DAC (−V).

Figure 2B:
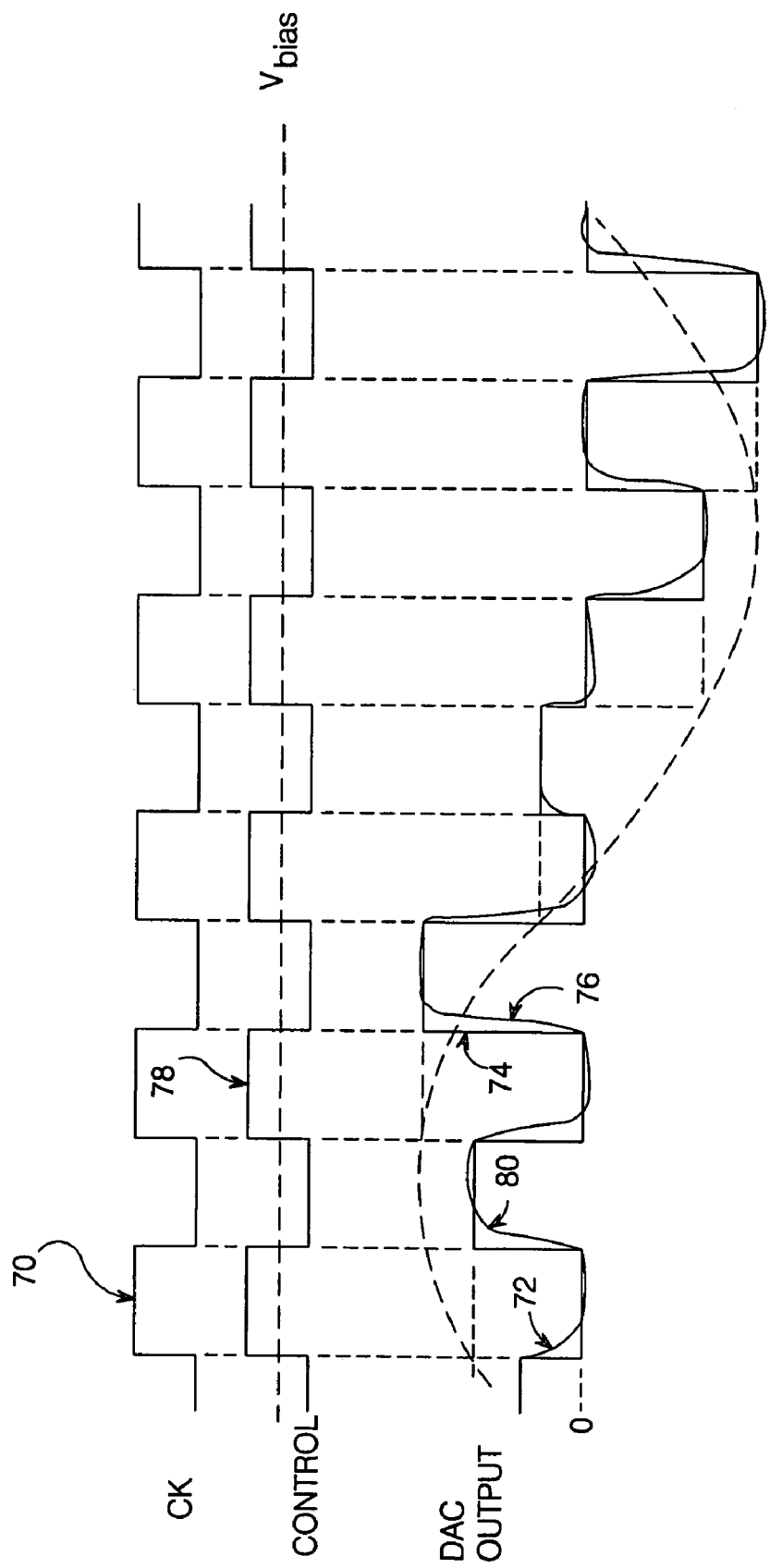

The operation of the DAC shown in FIG. 2a is illustrated with the timing diagram of FIG. 2b. When clock signal CK (70) goes high, current switch transistors 24a, 24b, 28a, 28b are closed in accordance with the digital word applied to the DAC's digital input lines, causing the voltages on at least some of intermediate nodes 32, 34, 36, 38 to change. However, the CONTROL signal (78) is arranged to track CK, such that it goes high when CK goes high. CONTROL is arranged such that its voltage when high is sufficiently greater than $V_{bias}$ to turn RZ current switch transistors 43b, 44a, 45b, 46a on and transistors 43a, 44b, 45a, 46b off, so that the currents applied to intermediate nodes 32, 34, 36, 38 are directed to circuit ground while CK is asserted. As such, switching noise that would otherwise appear on analog output lines 10 and 12 is prevented from reaching lines 10 and 12; as long as CK is high and RZ current switch transistors 43b, 44a, 45b, 46a are closed, none of the current source outputs are directed to analog output lines 10 and 12, and lines 10 and 12 are pulled to the "zero" potential (72) via output network 48. FIG. 2b depicts both an ideal DAC output (74), and what an actual DAC output (76) might look like.

When CK and CONTROL go low (such that CONTROL<$V_{bias}$), RZ current switch transistors 43b, 44a, 45b, 46a are turned off and RZ current switch transistors 43a, 44b, 45a, 46b are turned on, causing currents applied to intermediate nodes 32, 34, 36, 38 to be directed to analog output lines 10 and 12, such that lines 10 and 12 slew to non-zero analog voltages (80) determined by the number and magnitudes of the current source outputs connected to them.

Because RZ current switch transistors 43a, 44b, 45a, 46b are connected to a fixed voltage, clock noise that might otherwise be coupled to the analog output lines (as in prior art designs) is substantially reduced or eliminated. To ensure reliable operation of the RZ current switches, the CONTROL signal when high should be at least 100 mV greater than $V_{bias}$, and when low should be at least 100 mV less than $V_{bias}$ (for the NPN embodiment shown).

The DAC can be arranged such that the analog output lines are pulled to zero upon the occurrence of CK (as shown in FIG. 2b), or upon the occurrence of $\overline{CK}$. It is preferred, however, that the analog outputs be returned-to-zero upon the occurrence of CK, since this is when the intermediate node voltages change and generate the undesired switching noise. When so arranged, if the duration of clock signal CK is sufficiently long, the intermediate node voltages will have settled by the time that $\overline{CK}$ is asserted, thereby blocking all switching noise from analog output lines 10 and 12.

Clock signals CK and $\overline{CK}$ have fixed duty cycles, with 50% being preferred. A 50% duty cycle tends to block most of the switching noise, without sacrificing too much signal power. If the RZ portion of the switching cycle is shortened (by decreasing CK 50% duty cycle), signal power will be higher, though some switching noise may appear on the analog output lines. Increasing CK's duty cycle further reduces switching noise, but at the expense of signal power.

As noted above, output network 48 can comprise, for example, a R-2R ladder network. A typical implementation of a DAC 51 so arranged is shown in FIG. 2c. Here, each RZ circuit (52a, 52b, 52c, 52d, 52e) is as described above, with the current switch outputs coupled to analog output lines 10 and 12 via output network 48. In the conventional R-2R network shown, the RZ circuits which carry the MSB currents (52d, 52e) are connected directly to output lines 10 and 12, and the RZ circuits which carry the LSB currents (52a, 52b, 52c) are connected to output lines 10 and 12 via a resistive network that appropriately scales the currents. Analog output lines 10 and 12 would then typically be connected to respective load resistors 54, 56.

Figure 2C:
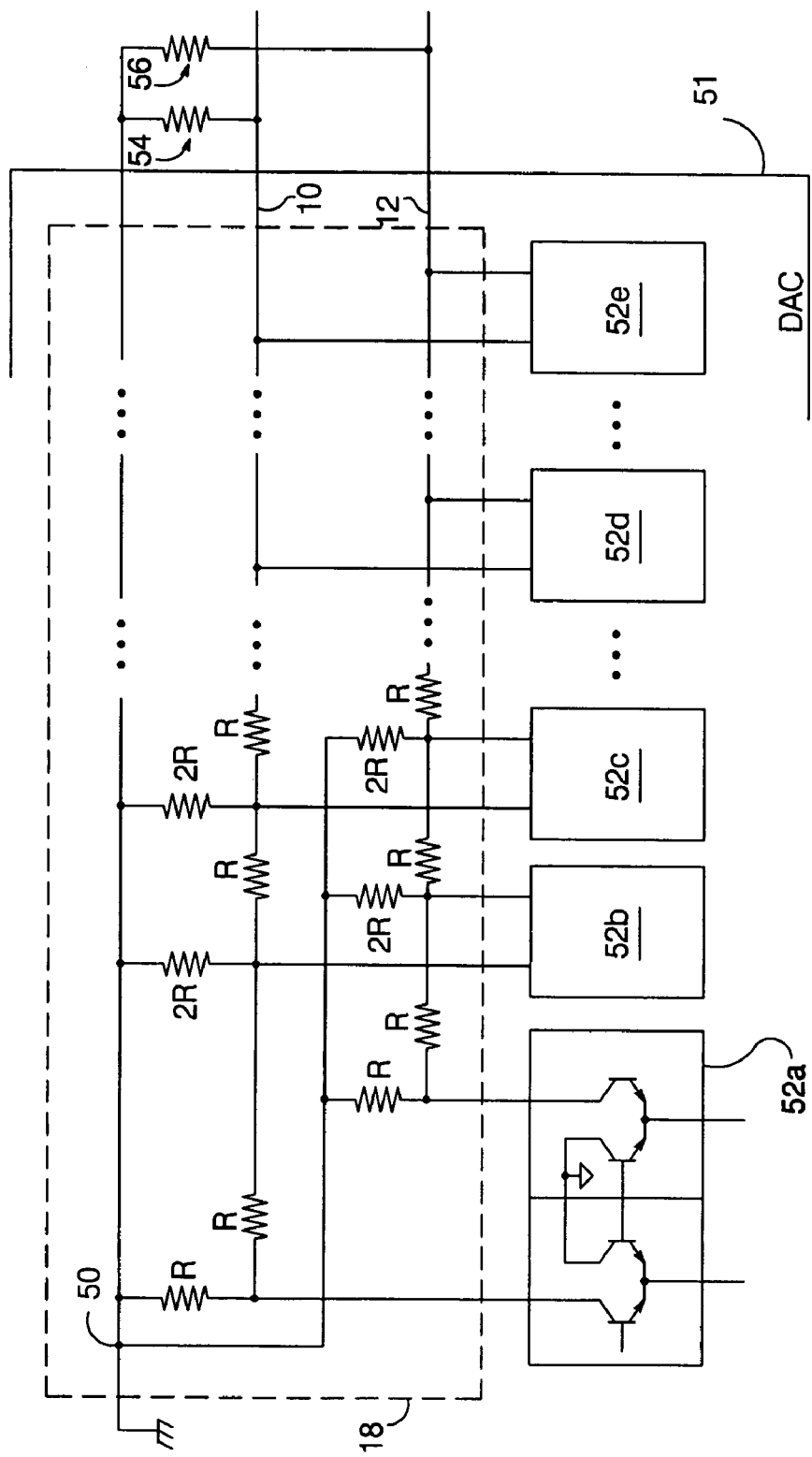
FIG. 2c is a schematic diagram of an output network that might be used with an RZ current switching DAC per the present invention.

Note that the use of a R-2R ladder network as shown in FIG. 2c is not essential to the invention. For example, all the RZ circuit outputs could be coupled directly to an analog output line with a single resistor serving as a pull-up device, as illustrated in FIGS. 5–9.

Figure 3A:
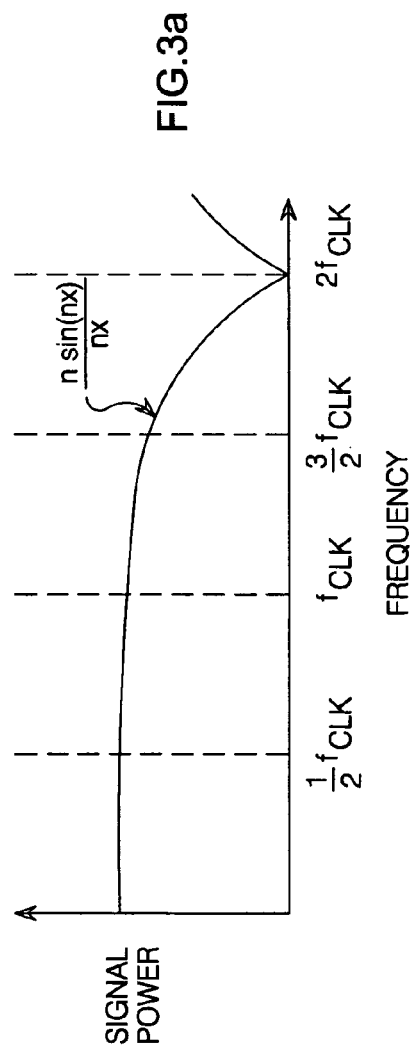

An output spectrum for a DAC in accordance with the present invention is shown in FIG. 3a. Here, the signal power falls off at a rate given by $$\frac{n \cdot \sin(nx)}{nx}$$

up to the $2 \cdot f_{CLK}$ frequency, where n is the duty cycle of clock signal CK and x is given by $$\frac{\pi * freq}{f_{CLK}},$$

where freq is the frequency of the DAC's analog output signal. The invention thus flattens and extends the DAC's frequency response when compared to the prior art: With a 50% duty cycle, the DAC's null frequency is moved out to $2 \cdot f_{CLK}$, thereby enabling its use with additional frequency bands—possibly even into the $3^{rd}$ Nyquist region. The invention thus extends the DAC's bandwidth, making it available for applications which operate at higher signal frequencies. For example, the DAC can be used as an IF DAC, thereby eliminating the need for an IF up-conversion mixer from a radio transmitter stage.

Figure 3B:
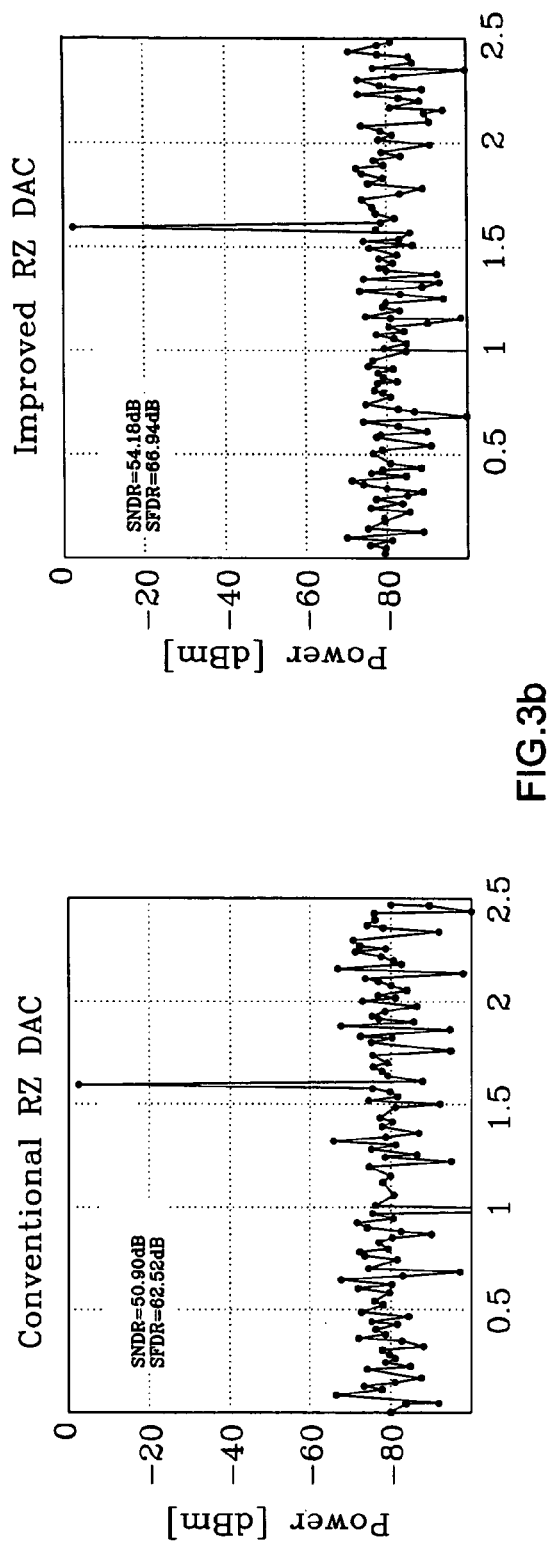
FIG. 3b compares the Signal-to-Noise and Distortion Ratio (SNDR) and the Spurious-free Dynamic Range (SFDR) performance of a conventional DAC with that of an RZ current switching DAC per the present invention.

As noted above, the present invention can substantially reduce clock noise when compared with prior art designs. This can be seen in the simulated results shown in FIG. 3b, which compares Signal-to-Noise and Distortion Ratio (SNDR) and Spurious-free Dynamic Range (SFDR) values for a conventional RZ DAC which uses a clocked transistor to couple current to an analog output line, and the present invention.

The RZ circuits are preferably integrated with the DAC's switched current sources, associated current switches, and control circuitry on a common substrate. The RZ circuits are preferably implemented with the same type of transistors used for the current sources' current switches, making integration on a common substrate very straightforward. This results in a current switching DAC which is simpler, consumes less power, and introduces less noise than more complex prior art approaches. For high frequency performance, the present DAC's transistors are preferably fabricated using Group III–V materials, such as gallium-arsenide (GaAs). GaAs transistors are faster, less noisy, have a better breakdown voltage, and are more linear than are silicon-based transistors.

Figure 4A:
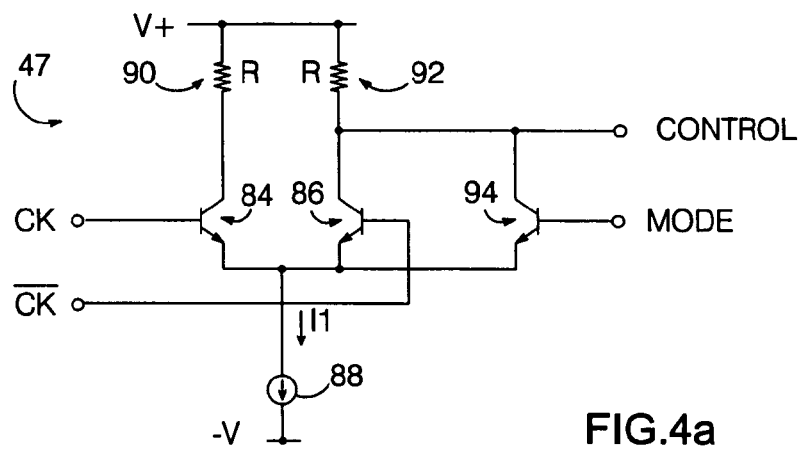
FIG. 4a is a control circuit as might be used with an RZ current switching DAC per the present invention.

One possible embodiment of control circuit 47 is shown in FIG. 4a. A pair of transistors 84, 86 are driven with CK and $\overline{CK}$, respectively, and biased with a current source 88 which provides a bias current I1. The transistors are connected to a supply voltage V+ via respective resistors 90 and 92, each of which has a resistance R; the CONTROL signal is provided at the junction of resistor 92 and transistor 86. Another transistor 94 is connected between resistor 92 and current source 88, and driven with a MODE signal.

Figure 4B:
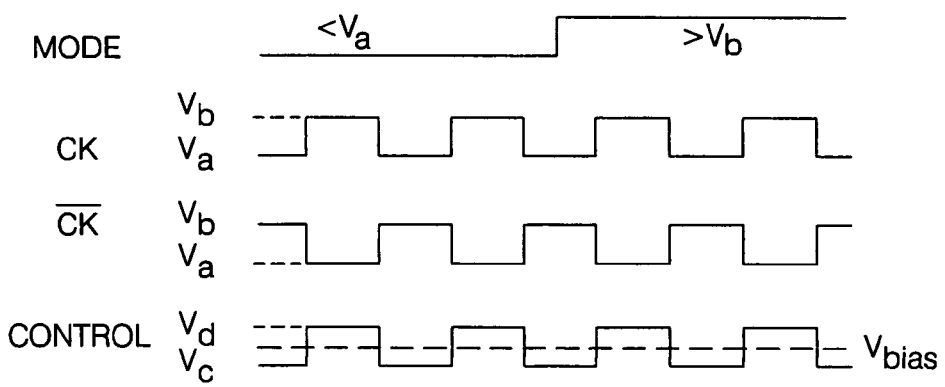

Operation of the control circuit of FIG. 4a is illustrated in FIG. 4b. Clock signals CK and $\overline{CK}$ toggle between voltages $V_a$ and $V_b$. When the MODE signal is less than $V_a$, preferably at least 100 mV less than $V_a$, transistor 94 is held off, transistors 84 and 86 will be turned on and off with CK and $\overline{CK}$, and CONTROL will track CK. CONTROL will toggle between $V_c$ and $V_d$, with $V_c$ given by: $V_c$=V+-I1*R, and $V_d$ being approximately equal to V+. As noted above, for proper operation, CONTROL needs to toggle above and below $V_{bias}$, preferably by at least 100 mV. $V_{bias}$, I1 and R should be chosen accordingly.

When the MODE signal is greater than $V_b$, preferably at least 100 mV more than $V_b$, transistor 94 is held on, such that CONTROL is maintained at a fixed voltage given by V+-I1*R. While CONTROL is kept at a fixed voltage at least 100 mV less than $V_{bias}$, the DAC operates in NRZ mode, with the RZ current switches operating such that current from the switched current sources is continuously directed to the analog output nodes. When in NRZ mode, current from the switched current sources is not being dumped to circuit ground as in RZ mode. As such, less power is wasted in NRZ mode. The MODE signal can be made user-selectable, so that the DAC can be operated in RZ or NRZ mode as needed.

Note that the implementation of control circuit 47 shown in FIG. 4a is merely exemplary. There are numerous ways in which a CONTROL signal in accordance with the present invention—i.e., one which tracks CK and toggles above and below $V_{bias}$—could be generated.

Figure 5:
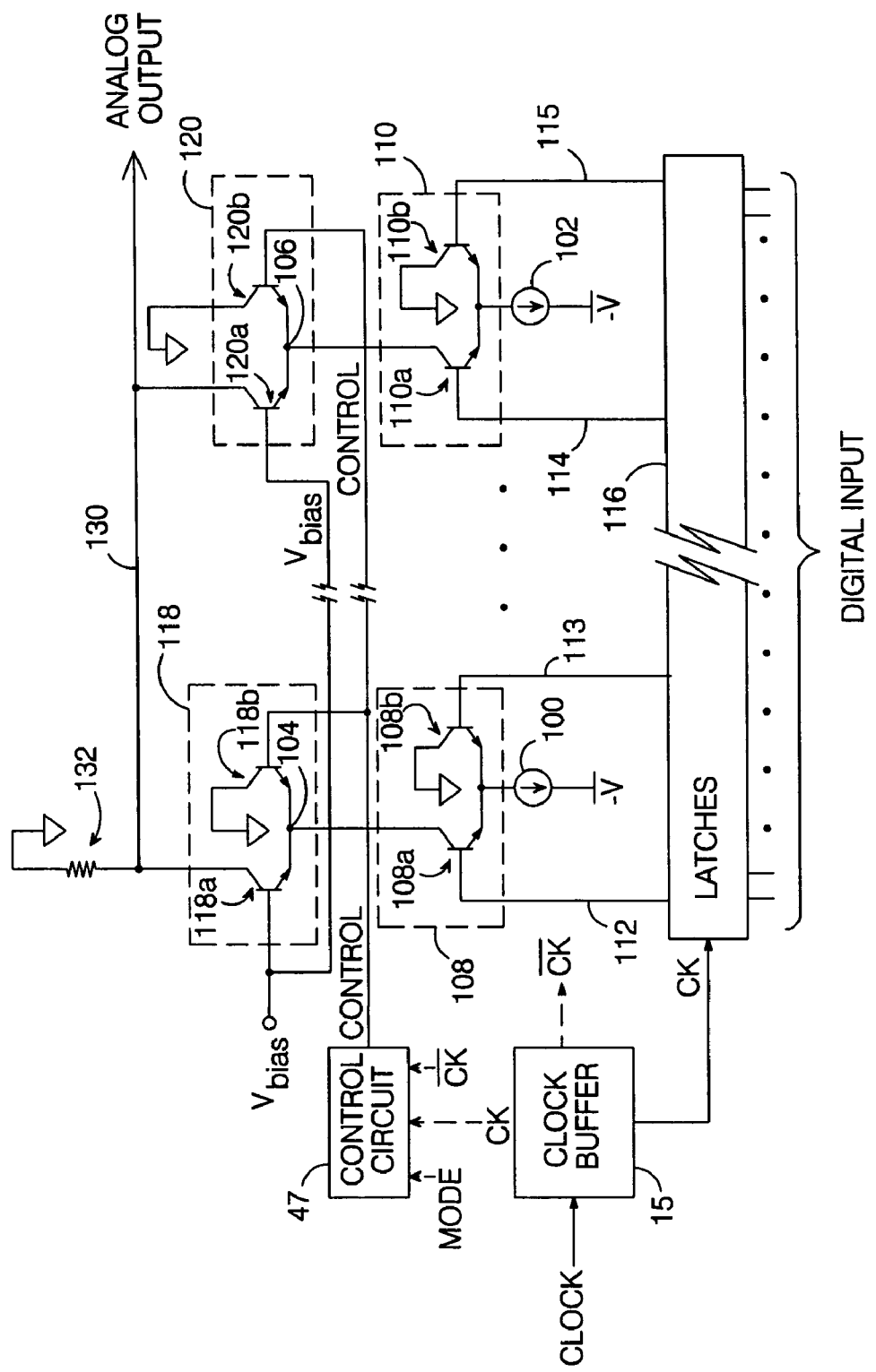
FIG. 5 is a block/schematic diagram of a single-ended embodiment of an RZ current switching DAC per the present invention.

The present invention is equally applicable to a current switching DAC having a single-ended analog output. One possible embodiment of such a DAC is shown in FIG. 5. Here, the outputs of current sources 100, 102 are connected to respective intermediate nodes 104, 106 via respective current switches 108, 110. Current switch 108 preferably comprises transistors 108a and 108b, which direct the output of current source 100 to intermediate node 104 or ground, respectively, and which are operated with respective control signals 112 and 113 provided by clocked circuitry 116. Current switch 110 preferably comprises transistors 110a and 110b, which direct the output of current source 102 to intermediate node 106 or ground, respectively, and which are operated with respective control signals 114 and 115 provided by clocked circuitry 116.

The intermediate nodes are connected to respective RZ circuits, each of which includes a transistor (118b, 120b) driven by a CONTROL signal which, when turned on, directs current from an intermediate node to circuit ground, and a transistor (118a, 120a) driven by bias voltage $V_{bias}$ which, when turned on, directs current from the intermediate node to single analog output line 130. As noted above, here the RZ current switch output is shown connected directly to analog output line 130, with a pull-up device 132 connected to pull the output to the DAC's pre-defined "zero" potential when CK is asserted—thereby providing the present DAC's RZ function.

Figure 6A:
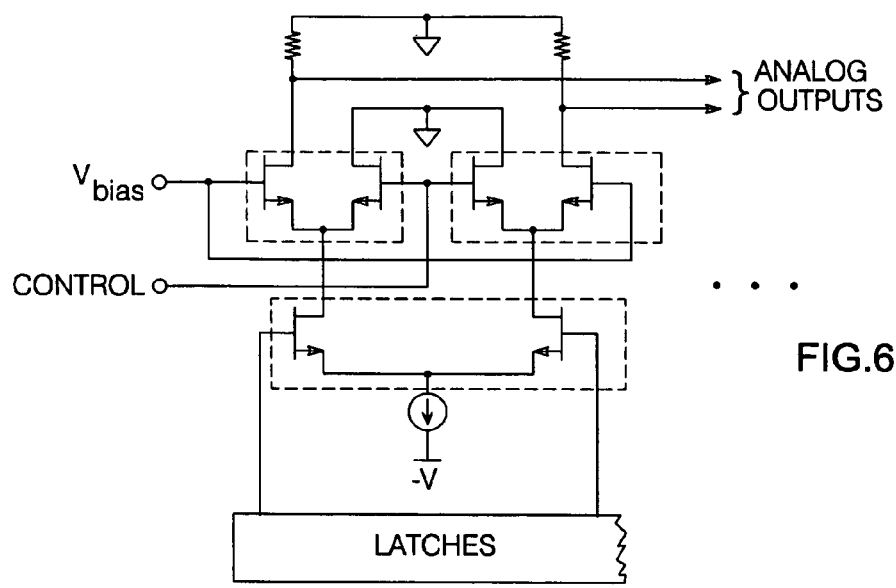
FIG. 6a is a block/schematic diagram of an embodiment of an RZ current switching DAC per the present invention which employs NMOS transistors.
Figure 6B:
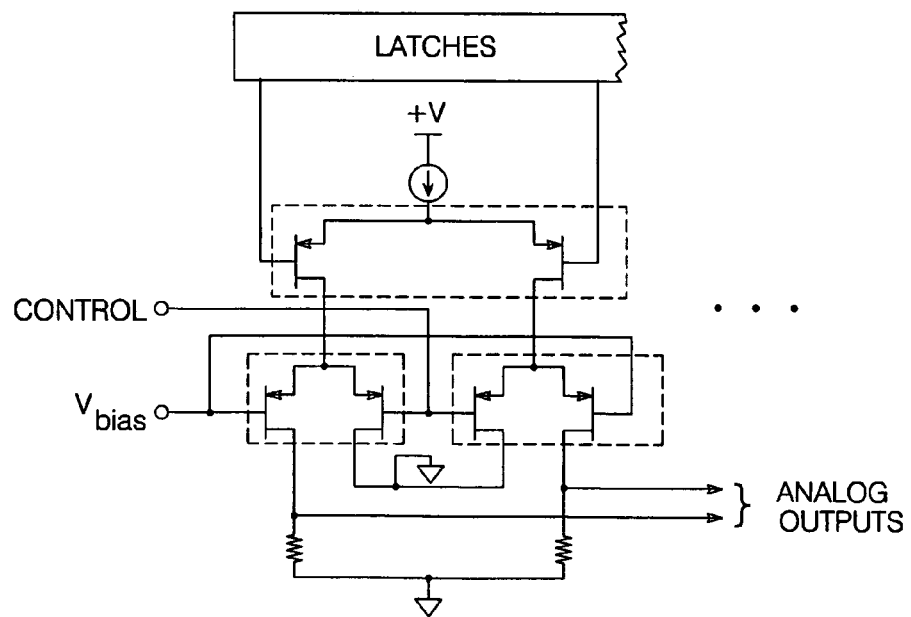
FIG. 6b is a block/schematic diagram of an embodiment of an RZ current switching DAC per the present invention which employs PMOS transistors.
Figure 7:
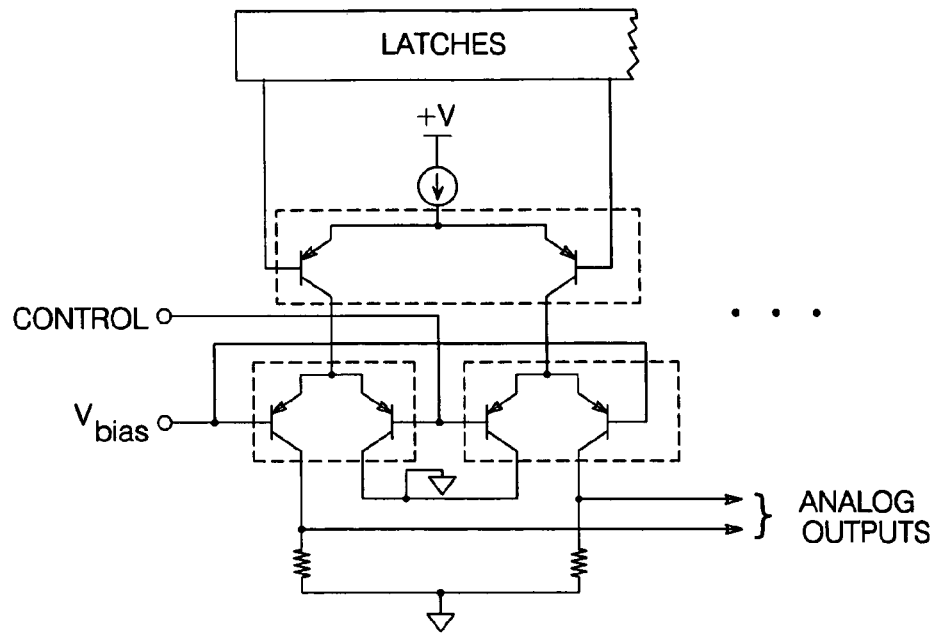
FIG. 7 is a block/schematic diagram of an embodiment of an RZ current switching DAC per the present invention which employs PNP transistors.
Figure 8:
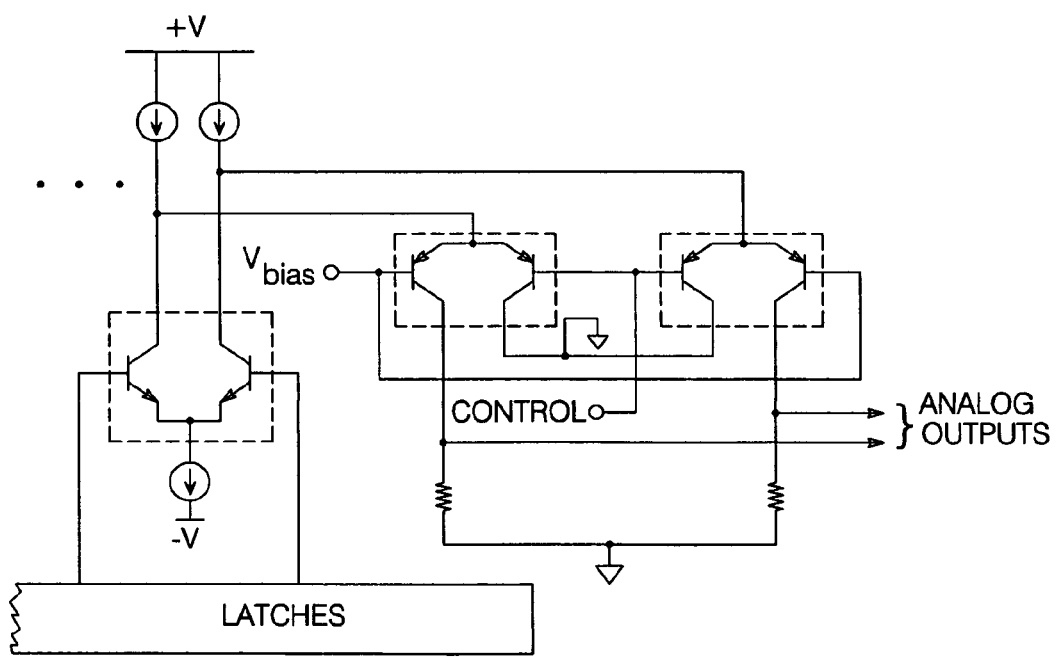
FIG. 8 is a block/schematic diagram of an embodiment of an RZ current switching DAC per the present invention which employs a combination of NPN and PNP transistors.
Figure 9:
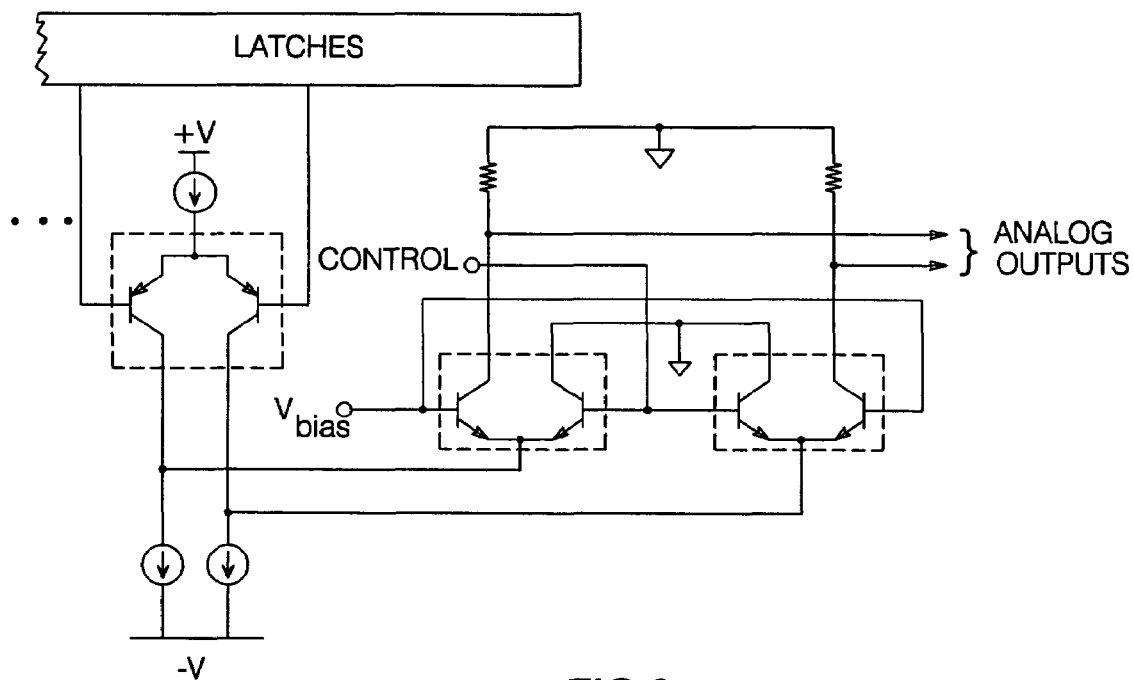
FIG. 9 is a block/schematic diagram of another embodiment of an RZ current switching DAC per the present invention which employs a combination of NPN and PNP transistors.

Though FIGS. 2a and 4 depict the present DAC as implemented with NPN transistors, the invention is equally applicable to implementations employing PNP transistors, FETs, or various combinations of these. Examples of some alternate implementations are shown in FIGS. 6–9; note that, for simplicity, the circuitry associated with only one current source is shown in these figures—an actual DAC would replicate the depicted circuitry numerous times. FIG. 6a depicts an RZ DAC per the present invention implemented with NMOS FETS, and FIG. 6b depicts a PMOS FET implementation. FIG. 7 shows an implementation using PNP transistors. In FIG. 8, the current switch connected to the current source is implemented with NPN transistors, while the RZ circuits' current switches are made from PNP transistors. FIG. 9 is similar to FIG. 8, except that, here, the current switch connected to the current source is implemented with PNP transistors, while the RZ circuits' current switches are made from NPN transistors. It is only essential that the current switching DAC include RZ circuits as defined herein, which return the analog output line or lines to the pre-defined "zero" potential once per switching cycle.

While particular embodiments of the invention have been shown and described, numerous variations and alternate embodiments will occur to those skilled in the art. Accordingly, it is intended that the invention be limited only in terms of the appended claims.

I claim:

1. A current switching digital-to-analog converter (DAC), comprising:
    an analog output node for which a "zero" potential has been defined which provides said DAC's analog output voltage;
    a digital input which receives a plurality of digital bits representative of a desired analog output voltage;
    a first clock signal CK;
    a second clock signal $\overline{CK}$ which is the inverse of said first clock signal;
    a plurality of current sources having respective outputs which are selectively directed to respective intermediate nodes in response to respective control signals, the states of said control signals varying with said digital bits and changing states in synchronization with said first clock signal CK;
    a control signal;

a plurality of return-to-zero (RZ) current switch circuits connected between respective intermediate nodes and said analog output node, each of said RZ circuits comprising:
   a first transistor connected between the intermediate node and said analog output node and driven with a fixed bias voltage $V_{bias}$, and
   a second transistor connected between the intermediate node and a fixed voltage and driven with said control signal;
said DAC arranged such that said control signal toggles above and below $V_{bias}$ such that, when said control signal toggles below $V_{bias}$, said second transistor turns off and said first transistor turns on and directs current to said analog output node, and when said control signal toggles above $V_{bias}$, said first transistor turns off and said second transistor turns on and directs current to said fixed voltage; and
an output network connected to said analog output node and arranged such that said analog output voltage is pulled to said "zero" potential when the currents applied to said intermediate nodes are directed to said fixed voltage via said RZ circuits.

2. The DAC of claim 1, wherein said control signal toggles in synchronization with said CK signal such that each of said RZ current switches directs a current applied to a respective one of said intermediate nodes to said fixed voltage in synchronization with CK, thereby preventing switching noise that arises when CK is asserted from appearing on said analog output node.

3. The DAC of claim 1, wherein said clock signal CK has a 50% duty cycle.

4. The DAC of claim 1, wherein said output network is a R-2R ladder network.

5. The DAC of claim 1, wherein said "zero" potential is circuit ground.

6. The DAC of claim 1, wherein said analog output node is a differential output comprising first and second output lines, each of said RZ circuits arranged to direct a current applied to a respective one of said intermediate nodes to said fixed voltage or to one of said first and second output lines in response to said control signal.

7. The DAC of claim 1, wherein the outputs of said plurality of current sources are selectively directed to respective intermediate nodes via respective data current switches, each of which has a current input, two current outputs, and two control signal inputs, and is arranged to direct a current applied to its current input to one or the other of its two current outputs in response to control signals applied to said control signal inputs, the current input of each data current switch connected to a respective current source output, the current outputs of each data current switch connected to respective intermediate nodes, and the control signal inputs of each data current switch connected to respective control signals.

8. The DAC of claim 7, wherein each of said data current switches comprises first and second bipolar transistors having their emitters connected to said current input, their collectors connected to respective ones of said current outputs, and their bases connected to respective ones of said control signal inputs.

9. The DAC of claim 7, wherein each of said data current switches comprises first and second field-effect transistors (FETs) having their sources connected to said current input, their drains connected to respective ones of said current outputs, and their gates connected to respective ones of said control signal inputs.

10. The DAC of claim 1, wherein said analog output node comprises a single output line and wherein one of the intermediate nodes connected to each of said data current switches is connected to ground.

11. The DAC of claim 1, wherein each of said first and second transistors are bipolar transistors, having their bases connected to $V_{bias}$ and said control signal, respectively, their emitters connected to said intermediate node, and their collectors connected to said analog output node and said fixed voltage, respectively.

12. The DAC of claim 11, wherein each of said first and second transistors are made from gallium-arsenide (GaAs).

13. The DAC of claim 1, wherein each of said first and second transistors are field-effect transistors (FETs), having their gates connected to $V_{bias}$ and said control signal, respectively, their sources connected to said intermediate node, and their drains connected to said analog output node and said fixed voltage, respectively.

14. The DAC of claim 1, wherein said current sources and RZ circuits are integrated together on a common substrate.

15. The DAC of claim 1, wherein said fixed voltage is circuit ground.

16. The DAC of claim 1, further comprising a control circuit which generates said control signal, said control circuit arranged to selectably operate in an "RZ" mode or an "NRZ" mode, said control circuit when in said "RZ" operating mode arranged to generate said control signal such that it tracks said CK signal, and when in said "NRZ" operating mode arranged to generate said control signal such that it has a fixed voltage which is less than $V_{bias}$ so that said first transistor is on and said second transistor is off.

17. The DAC of claim 16, wherein said control circuit comprises:
   a first transistor having its current circuit connected between first and second nodes and its control input connected to said CK signal;
   a second transistor having its current circuit connected between a third node and said second node and its control input connected to said $\overline{CK}$ signal;
   a third transistor having its current circuit connected between said third node and said second node and its control input connected to a "mode" signal;
   first and second resistors connected between said first and third nodes, respectively, and a first supply voltage, said control signal provided at said third node; and
   a bias current source connected between said second node and a second supply voltage;
   such that when said "mode" signal is such that said third transistor is off said control signal tracks said CK signal, and when said "mode" signal is such that said third transistor is on said control signal has a fixed voltage which is less than $V_{bias}$.

18. The DAC of claim 1, wherein said output network is a resistor connected between said analog output node and a node at said "zero" potential and said current conducted by said first transistor is directly connected to said analog output node.

19. A current switching digital-to-analog converter (DAC), comprising:
   a differential analog output comprising first and second output lines for which a "zero" potential has been defined, said differential analog output providing said DAC's analog output voltage;
   a first clock signal CK;
   a second clock signal $\overline{CK}$ which is the inverse of said first clock signal;

clocked circuitry which receives said first clock signal CK and a digital input comprising a plurality of digital bits representative of a desired analog output voltage, and provides as outputs a plurality of control signals the states of which vary with said digital bits, said control signals changing state in synchronization with said first clock signal CK;

a plurality of current sources having respective outputs;

a plurality of pairs of intermediate nodes, each comprising first and second intermediate nodes;

a plurality of data current switches arranged to direct respective current source outputs to the first or second intermediate node of a respective one of said pairs of intermediate nodes, each of said pairs of data current switches comprising:
- a first transistor arranged to direct said current source output to the first intermediate node of said pair of intermediate nodes in response to a respective one of said control signals, and
- a second transistor arranged to direct said current source output to the second intermediate node of said pair of intermediate nodes in response to a respective one of said control signals;

a control signal;

a plurality of pairs of return-to-zero (RZ) circuits connected between respective pairs of said intermediate nodes and said first and second output lines, each of said pairs of RZ circuits comprising:
- a first RZ circuit comprising:
  - a first transistor connected between the first intermediate node of said pair of intermediate nodes and one of said first and second analog output lines and driven with a fixed bias voltage $V_{bias}$, and
  - a second transistor connected between said first intermediate node and circuit ground and driven with said control signal; and
- a second RZ circuit comprising:
  - a first transistor connected between the second intermediate node of said pair of intermediate nodes and the other of said first and second analog output lines and driven with said fixed bias voltage $V_{bias}$, and
  - a second transistor connected between said second intermediate node and circuit ground and driven with said control signal; and first and second output networks connected to said first and second analog output lines, respectively, and arranged such that said analog output lines are pulled to said "zero" potential when said intermediate nodes are directed to circuit ground via said RZ circuits;

said DAC arranged such that said control signal toggles above and below $V_{bias}$ in synchronization with said CK signal, such that, when said control signal toggles below $V_{bias}$, said second transistors turn off and said first transistors turn on and direct current to said analog output nodes, and when said control signal toggles above $V_{bias}$, said first transistors turn off and said second transistors turn on and direct current to said circuit ground when said control signal toggles above $V_{bias}$, such that switching noise that arises when said clock signal CK is asserted is prevented from appearing on said analog output nodes.

20. The DAC of claim 19, wherein said first and second output networks are respective R-2R ladder networks.

21. The DAC of claim 19, wherein said data and RZ current switches comprise bipolar transistors.

22. The DAC of claim 19, wherein said data and RZ current switches comprise field-effect transistors (FETs).

23. The DAC of claim 19, wherein said "zero" potential is circuit ground.

24. The DAC of claim 19, wherein the magnitudes of said current source outputs are approximately equal.

25. The DAC of claim 19, wherein the magnitudes of said current source outputs are not equal.

26. The DAC of claim 19, wherein said current sources, said data current switches, and said RZ circuits are integrated together on a common substrate.

27. The DAC of claim 19, wherein said clocked circuitry comprises a plurality of latches which are latched in response to clock signal CK.

28. A current switching digital-to-analog converter (DAC), comprising:

an analog output line for which a "zero" potential has been defined which provides said DAC's analog output voltage;

a first clock signal CK;

clocked circuitry which receives said first clock signal CK and a digital input comprising a plurality of digital bits representative of a desired analog output voltage, and provides as outputs a plurality of control signals the states of which vary with said digital bits, said control signals changing state in synchronization with said first clock signal CK;

a plurality of current sources having respective outputs;

a plurality of pairs of intermediate nodes, each comprising first and second intermediate nodes, each of said second intermediate nodes connected to circuit ground;

a plurality of data current switches arranged to direct respective current source outputs to the first or second intermediate node of a respective one of said pairs of intermediate nodes, each of said pairs of data current switches comprising:
- a first transistor arranged to direct said current source output to the first intermediate node of said pair of intermediate nodes in response to a respective one of said control signals, and
- a second transistor arranged to direct said current source output to the second intermediate node of said pair of intermediate nodes in response to a respective one of said control signals;

a control signal;

a plurality of return-to-zero (RZ) circuits connected between respective ones of said first intermediate nodes and said analog output line, each of said RZ circuits comprising:
- a first transistor connected between said first intermediate node and said analog output line and driven with a fixed bias voltage $V_{bias}$, and
- a second transistor connected between said first intermediate node and circuit ground and driven with said control signal;

said DAC arranged such that said control signal toggles above and below $V_{bias}$, when said control signal toggles below $V_{bias}$, said second transistor turns off and said first transistor turns on and directs current to said analog output node, and when said control signal toggles above $V_{bias}$, said first transistor turns off and said second transistor turns on and directs current to said fixed voltage; and an output network connected to said analog output line and arranged such that said analog output line is pulled to said "zero" potential when said first intermediate nodes are directed to circuit ground via said RZ circuits, such that said RZ circuits prevent switching noise that arises when said clock signal CK is asserted from appearing on said analog output line.

* * * * *